United States Patent [19]

Hartoog et al.

[11] Patent Number: 5,521,836
[45] Date of Patent: May 28, 1996

[54] METHOD FOR DETERMINING INSTANCE PLACEMENTS IN CIRCUIT LAYOUTS

[75] Inventors: Mark R. Hartoog, Los Gatos; James A. Rowson, Fremont, both of Calif.

[73] Assignee: VLSI Technology, Inc., San Jose, Calif.

[21] Appl. No.: 355,310

[22] Filed: Dec. 12, 1994

Related U.S. Application Data

[63] Continuation of Ser. No. 723,138, Jun. 28, 1991, abandoned.

[51] Int. Cl.$^6$ .................................................. G06F 17/50
[52] U.S. Cl. .............................................. 364/491; 364/490
[58] Field of Search .................................. 364/488, 489, 364/490, 491

[56] References Cited

U.S. PATENT DOCUMENTS

| | | | |
|---|---|---|---|
| 3,617,714 | 11/1971 | Kernighan | 364/489 |
| 4,922,432 | 5/1990 | Kobayashi et al. | 364/490 |
| 4,967,367 | 10/1990 | Piednoir | 364/489 |
| 5,187,784 | 2/1993 | Dowson | 394/500 |

OTHER PUBLICATIONS

"Partitioning and Placement Technique for CMOS Gate Arrays" by Odaware et al., IEEE Trans. on Computer–Aided Design, CAD–6, No. 3, 1987, pp. 355–362.
"A Class of Min–Cut Placement Algorithms" by Brener.
"A Procedure for Placement of Standard–Cell VLSi Circuits" by Dunlop et al., IEEE Trans. on Computer–Aided Design, CAD–4, No. 1, 1985, pp. 92–98.
Fiduccia, C. M. and Mattheyses, R. M.; "A Linear–Time Heuristic for Improving Network Partitions"; *19th Design Automation Conference*; pp. 241–247.
F. K. Hwang, "The Rectilinear Steiner Problem", Design Automation Fault–Tolerant Computing, vol. 2, pp. 303–310, 1978 Computer Science Press, Inc.
M. R. Garey, D. S. Johnson and L. Sockmeyer, "Some simplified NP–complete graph problems", Theor. Computer Science, vol. 1, pp. 237–267.
M. A. Breuer, "Min–Cut Placement", Journal Design Automation Fault–Tolerant Computing, vol. 1, pp. 343–362, 1977.

*Primary Examiner*—Vincent N. Trans
*Attorney, Agent, or Firm*—Burns, Doane, Swecker & Mathis

[57] ABSTRACT

A process for producing placement information for layouts of circuit elements of networks that are initially represented by netlists such that datapaths can be advantageously placed into a regular array. In one preferred embodiment, the method includes steps of encoding datapath information in instance names of a netlist generated by a datapath compiler; using the encoded datapath information for defining partitioned areas that preserve datapaths; and generating circuit layouts from the netlist, which layouts contain floor plans of the datapaths.

17 Claims, 5 Drawing Sheets

METHOD FOR DETERMINING INSTANCE PLACEMENTS IN CIRCUIT LAYOUTS

This application is a continuation of application Ser. No. 07/723,138, filed Jun. 28, 1991 now abandoned.

BACKGROUND OF THE INVENTION

1. Field of the Invention

The present invention relates to methods for determining the placement of elements in layouts of electrical and electronic circuits and, more particularly, to methods for automatically developing layout arrangements for circuits initially represented as netlists generated by compiler systems.

2. State of the Art

Generally speaking, a netlist is a compilation of information that represents the interconnections between instances of electronic parts, such as cells, in electrical or electronic circuits. Netlists are widely used in conjunction with electronic logic circuits where, for example, element definitions, or "instances," may be as simple as a resistor or as complex as a microprocessor. Netlists do not, however, contain information as to how instances are to be placed relative to one another in physical circuits. For example, even though a netlist may list instances "A" and "B" as being interconnected, these two instances may be immediately adjacent one another, or may be separated physically by hundreds, or even thousands, of other instances in a physical realization of the netlist.

Netlists can be generated by circuit design systems known as datapath compilers. In practice, datapath compilers produce netlists from "high level" schematics. Most datapath compilers produce "optimized" layout arrangements. The optimized layouts are useful because they produce datapaths that contain relatively small quantities of wiring.

The term "datapath," as used in the present context, refers to grids of horizontally and vertically directed wires that have digital logic elements located at some of their intersections. For example, the horizontally-directed wires can be databuses for arithmetic logic units. In that case, the vertically-directed wires are normally used for control, shift and carry signals.

The determination of cell placement locations from netlists is normally done by place-and-route, or placement, processes. Placement processes allow a circuit designer to provide physical circuit layouts from netlists. One example of a placement process is disclosed in U.S. Pat. No. 3,617,714 to Kernighan et al. Another example of a placement process is disclosed in an article by C. M. Fiduccia et al., "A Linear-Time Heuristic For Improving Network Partitions", *Proceedings of the 19th ACM Design Automation Conference* (1982).

The article "MINCUT Placement" by M. A. Breuer in the *Journal of Design Automation Fault-Tolerant Computing*, Vol. 1, 1977, pp. 343–362, provides an exemplary MINCUT placement process for determining instance locations in layouts when circuit information is initially provided by netlists. According to the MINCUT placement process, all instances of a netlist are initially placed into a rectangular area, and then the area is recursively partitioned both vertically and horizontally. For example, an area that initially contains all of the netlist instances may be first cut horizontally into two areas; then, the area may be cut vertically into four areas, and so forth.

At each step in the MINCUT process, the object is to minimize the number of node connecting signal lines, or "nets" that cross a partitioning line while maintaining balance between the two sections of a partitioned area according to a predetermined criterion. Whenever an instance is moved across a partition line, an evaluation is made to determine the change in the number of nets crossing the partition.

In the evaluation, the "cost" of moving an instance is measured by the number of nets that cross the partition. Only instance moves that do not violate the predetermined criterion are allowed, and each instance is moved once, and only once, per pass. The instance move that most improves the cost function (or least degrades the function) is selected as the "best" move. Whenever a balanced partition with a cost better than any previously balanced partition is attained, that partition is deemed to be the optimal partition and is used for evaluating subsequent partitions.

Typically, a MINCUT optimization process is continued, with alternating horizontal and vertical cuts, until each partitioned area contains less than a specified number of instances. Then, in standard cell placement, partitioned instances are formed into rows.

Place-and-route processes such as the MINCUT process are aimed at minimizing the total length of all wires. Although these processes are relatively effective, it would be desirable to further optimize the organization of a circuit layout originally specified as a netlist.

SUMMARY OF THE INVENTION

Generally speaking., the present invention provides a method for producing placement information for network layouts that are initially represented by netlists. The present invention is premised on a recognition that the total length of all wires in a circuit layout does not produce optimal performance of a datapath. Accordingly, in preferred embodiments, methods for operating upon netlists are provided wherein datapaths are advantageously placed into regular arrays before optimizing wire lengths.

In one preferred embodiment, the method of the present invention comprises the steps of: attaching information to netlist instances identifying their approximate position in a regular structure; using the attached information for defining partitioned areas of the regular structure; generating circuit layouts from the netlist, which layouts contain the partitioned areas; and optimizing a circuit layout containing the partitioned areas using standard placement routines to provide final detailed placement of instances.

In a preferred embodiment of the present invention, the datapath compiler provides a hierarchical netlist wherein the top level of the netlist identifies instances of functional units, each of which has a unique instance name. Then, to form partitioned areas in the circuit layout, the instance names are concatenated such that each partitioned area contains all of the instance names from a netlist having a common functional unit and bit instance name. In a preferred embodiment, the MINCUT technique is then used for optimizing the circuit layout with the partitioned areas arranged in a rectangular grid.

In another preferred embodiment, the method of the present invention comprises the steps of encoding datapath information as instance names in a netlist generated by a datapath compiler; using the encoded data for defining partitioned areas that preserve datapaths; and generating circuit layouts from the netlist, which layouts contain the floor plans of the datapaths. Thus, in a process of the present invention, arbitrary instance placement is avoided and, instead, information that identifies datapath functions and their interconnections is provided to a datapath compiler that produces a hierarchical netlist.

BRIEF DESCRIPTION OF THE DRAWINGS

The present invention can be further understood by reference to the following description and attached drawings. In the drawings.

DETAILED DESCRIPTION OF THE PREFERRED EMBODIMENTS

Figure 1:
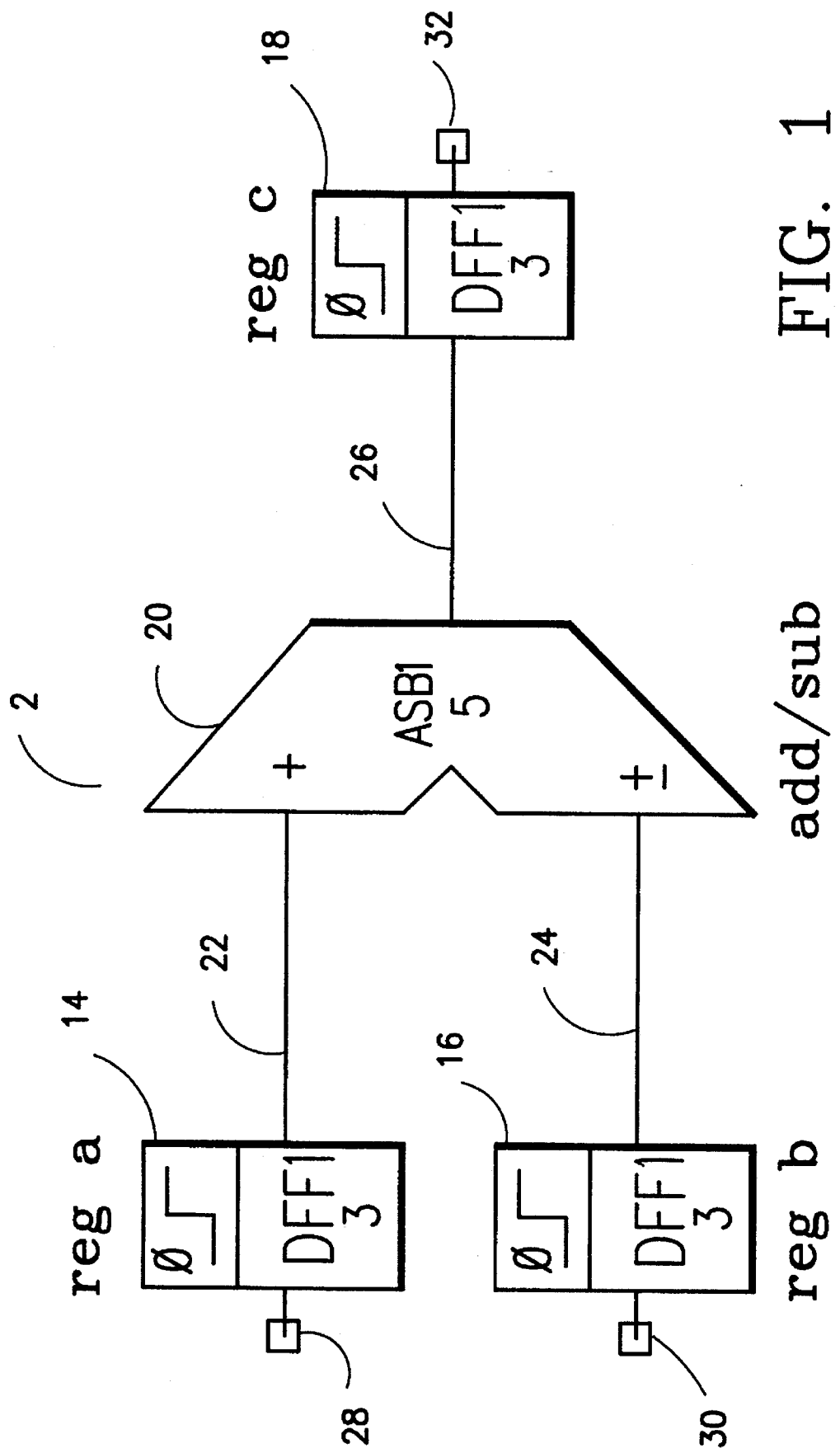
FIG. 1 shows an exemplary datapath specification input by a user.

FIG. 1 shows a datapath, generally designated by the number 2, comprised of interconnected functional units 14, 16, 18 and 20. Typically, each of the functional units has a different function in the datapath. The three functional units 14, 16 and 18 in FIG. 1 are registers having a four-bit structure, and the functional unit 20 is an adder/subtractor. In the illustrated embodiment, functional unit 14 includes four bit locations $a_0$ through $a_3$, functional unit 16 includes four bit locations $b_0$ through $b_3$, and functional unit 18 includes four bit locations $c_0$ through $c_3$.

Each bit location in the functional units of FIG. 1 can comprise a single instance or can comprise a number of instances that, together, provide the logical result designated by the bit location. For example, any one of the aforementioned twelve bit locations (e.g., bit location $b_1$) might include a single primitive (i.e., basic) instance structure such as, for example, a flip-flop. More typically, however, each bit location comprises a combination of interconnected instances.

If each bit location in register "a" of FIG. 1 were represented as a single instance in a netlist, a conventional place-and-route process could locate the instances in a circuit layout. As mentioned previously, such processes are aimed at minimizing the total length of all wires in the circuit layout. However, recognizing that minimization of the total length of all wires does not produce optimal datapata performance, the present invention is directed to processes wherein the instances of a netlist are arranged in a regular array. As referenced herein, a regular array is one in which the wires routed between bit locations of interconnected functional units are of similar length and the wires used to route control signals to each funcational unit are of similar length.

In accordance with a preferred embodiment, instance placement locations are "rationalized" in physical circuit layouts generated from netlists. The term "rationalized" refers to the location of instances in circuit layouts such that the regular flow of data in the datapath is preserved. For exemplary purposes, the generation of a circuit layout will be described in terms of the MINCUT place-and-route process.

Figure 5:
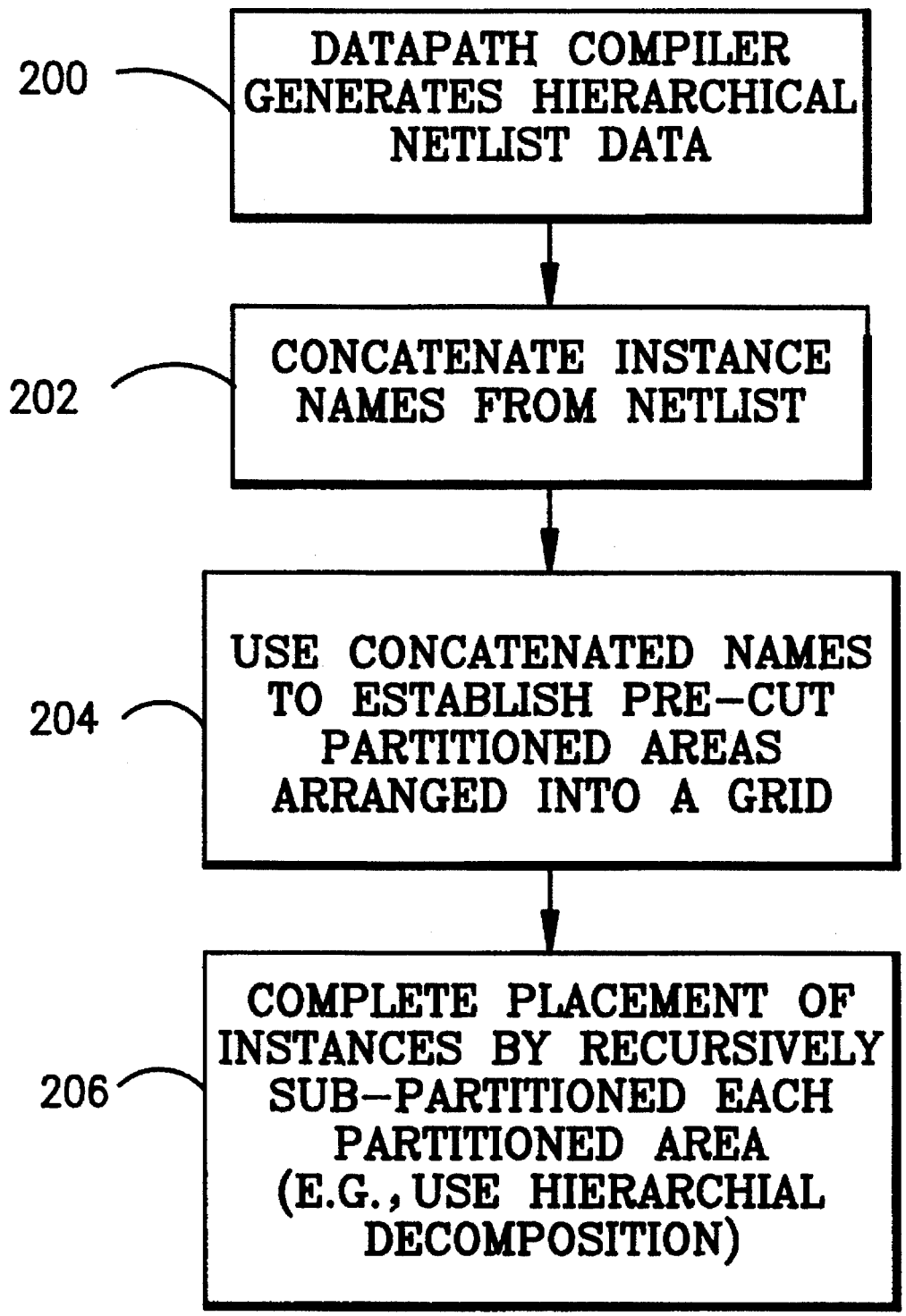
FIG. 5 shows a flow chart representing an exemplary method in accordance with the present invention.

FIG. 5 illustrates a flow chart for describing exemplary methods which can be implemented in accordance with the present invention.

As a first step 200 of a preferred embodiment, data for forming partitions is supplied in a netlist generated by a datapath compiler. Preferably, a datapath compiler provides a hierarchical netlist wherein the top level of the netlist identifies instances of functional units, each of which has a unique instance name. For example, all circuit elements associated with functional units "a" "b" or "c" can be identified in the netlist with prefix names such as "funcunitA", "funcunitB" and "funcunitC" respectively Within each functional unit, the bit positions can be designated as instances with unique instance names such as "b0", "b1", and so forth.

When a netlist constructed as above is operated upon, or "flattened" to produce a circuit layout, the instance names can be concatenated (i.e., combined) in step 202 by a place-and-route process. For example, a concatenation of the names of functional units and bit positions can be done such that names like "funcunit1.b0" and "funcunit2.b1" are obtained. Furthermore, the entire datapath can have a name concatenated to the front of the names created by the datapath compiler. Then, the concatenated names can be used in step 204 to define the partitioned areas when physical circuit layouts are generated from netlists using place-and-route processes such as the MINCUT process.

In practice, known datapath compilers usually generate names for functional units in the order in which the functional units occur in the netlist. For example, the first bit which is read is identified with 0th location of a first functional unit Subsequently, "n" partitions are created, where "n" is the last bit to be associated with the first functional unit. Similarly, "l" partitions are created for the bit locations of a second functional unit, "m" partitions are created for the bit locations of a third functional unit, and so forth, with the indexes "l" and "m" representing the last bits associated with the second and third functional units, respectively.

Using a preferred method of the present invention, a place-and-route process reads user-specified instance names for functional units in the hierarchical netlist. Then various pre-cut partitioned areas are established, where each partitioned area includes all of the instance names containing a common functional unit and bit instance identifier as a first portion of their names in the netlist. For example, any instance name which refers to bit $a_0$ of functional unit "a" (together with any other characters) is included in a pre-cut partitioned area $a_0$. The pre-cut partitioned areas are then arranged in a rectangular grid.

It can be appreciated that the above-described process does not pre-cut partitioned areas to the level of individual instances. Instead, pre-cuts are only made to specify the "floor plan" of a datapath. Thereafter, conventional placement techniques are used in step 206 to complete placement of the instances by recursively sub-partitioning each partitioned area.

More particularly, after pre-cut partitioned areas have been developed from information generated by the datapath compiler and have been arranged into a rectangular grid, the circuit layout can be optimized. For example, the MINCUT process can be used for optimizing the circuit layout by sub-partitioning each partitioned area in accordance with a predetermined recursive criterion until detailed placement of netlist instances has been completed.

This process is referred to as a "hierarchical decomposition" of each partitioned area subject to a criterion. That is, instance placement in a partitioned area is optimized by first sub-partitioning each pre-cut partitioned area vertically into sub-partitioned areas, then horizontally, then vertically and so forth in a recursive manner.

When the MINCUT process is employed, an object of the hierarchical decomposition is to determine instance locations such that instance interconnection costs are reduced (i.e., interconnection distances are minimized). The cost value of sub-partition areas is determined as a function of the number of nets that cross the sub-partition. After selecting a given sub-partition with a first placement and routing of circuit elements, the sub-partition is modified and a readjusted cost value determined. The cost value and the readjusted cost value are then compared. The placement and routing of the sub-partitioned areas having the lower cost is then selected.

In view of the preceding discussion, various advantages of the above-described method can be appreciated. For example, instance placement in accordance with the above-described method results in an easy-to-wire circuit layout. Further, instances are placed in layouts such that similar wire lengths are used for all bits of the data busses and similar wire lengths are used for the control lines. This placement thus produces a regular array which generally optimizes datapath performance.

A circuit layout produced in accordance with a preferred method will now be described in connection with the exemplary FIG. 1 datapath. Initially, the user draws a schematic to specify the datapath. FIG. 1 shows the input specification for a datapath which includes the three functional units 14, 16, 18 (representing registers "a" "b" and "c"), and the functional unit 20 (representing adder/subtractor 20).

A wire 22 is drawn to interconnect register 14 with an input to the adder/subtractor 20, and a wire 24 is drawn to interconnect register 16 with another input of the adder/subtractor 20. Further, a wire 26 is drawn to interconnect an output of the adder/subtractor with the register 18. Input connectors 28 and 30 are included with respect to registers 14 and 16, respectively and an output connector 32 is included with respect to the output register 18.

Figure 2:
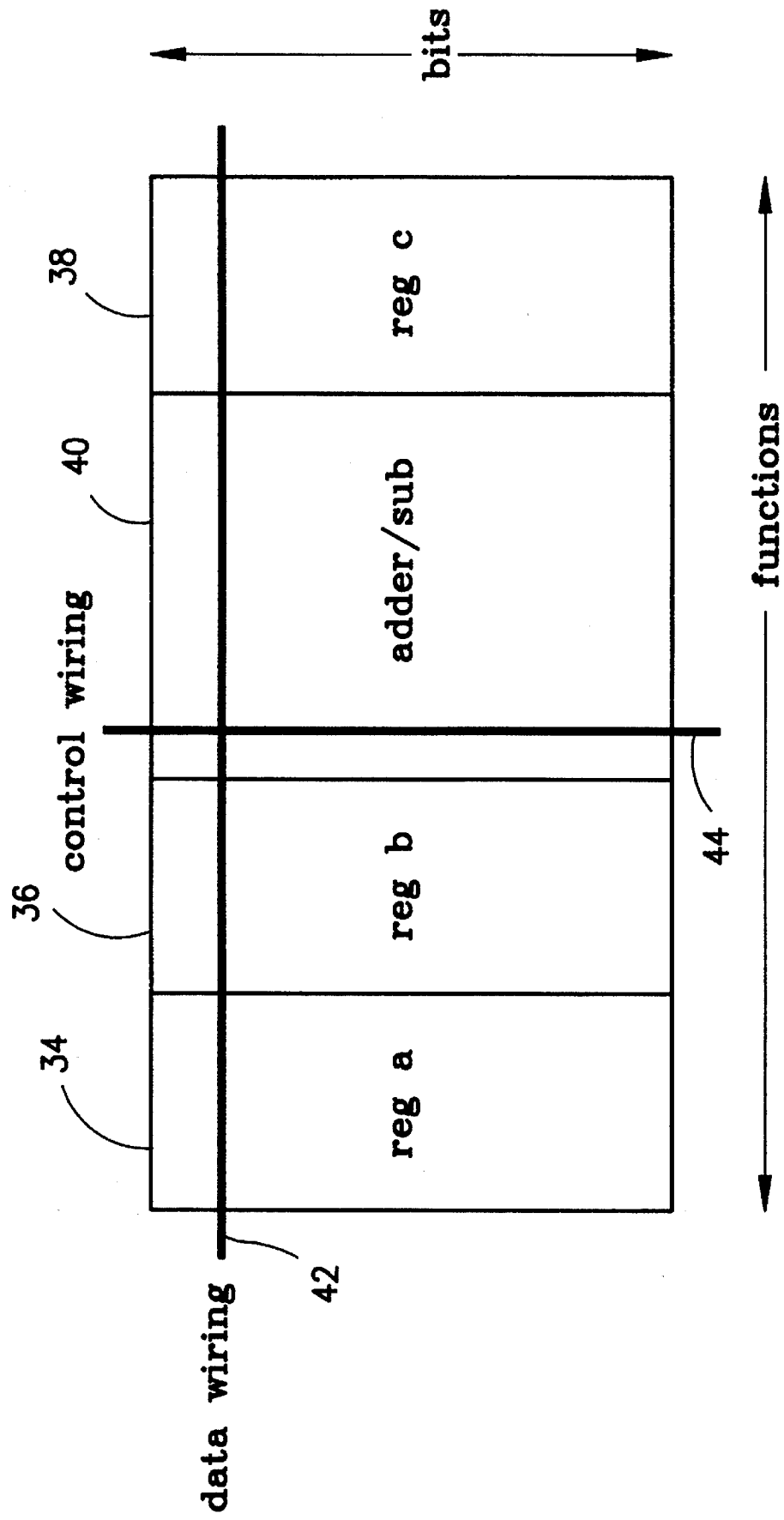
FIG. 2 shows a general floor plan of the FIG. 1 datapath.

FIG. 2 shows a floor plan for the FIG. 1 datapath obtained via pre-cuts of the netlist. In FIG. 2, the registers 14, 16 and 18 are layed out as a regular array of functional units represented by columns 34, 36 and 38, respectively. The adder/subtractor 20 is also a functional unit layed out as a column 40 between the functional columns 36 and 38.

In the FIG. 2 floor plan, bits of each functional unit are aligned vertically in the column, while functions are aligned horizontally. Using this arrangement permits a reduction and simplification of the wiring required relative to the amount of logic.

Accordingly, data wiring between bits can be easily represented as horizontal line 42. Similarly, the datapath control wiring can be easily represented as vertical line 44. For example, the control wiring can include a signal line to determine whether the adder/subtractor should add or subtract inputs received from registers 34 and 36. Alternately, the control wire may include a clock signal used to read or write information to or from bit locations of the registers.

Figure 3:
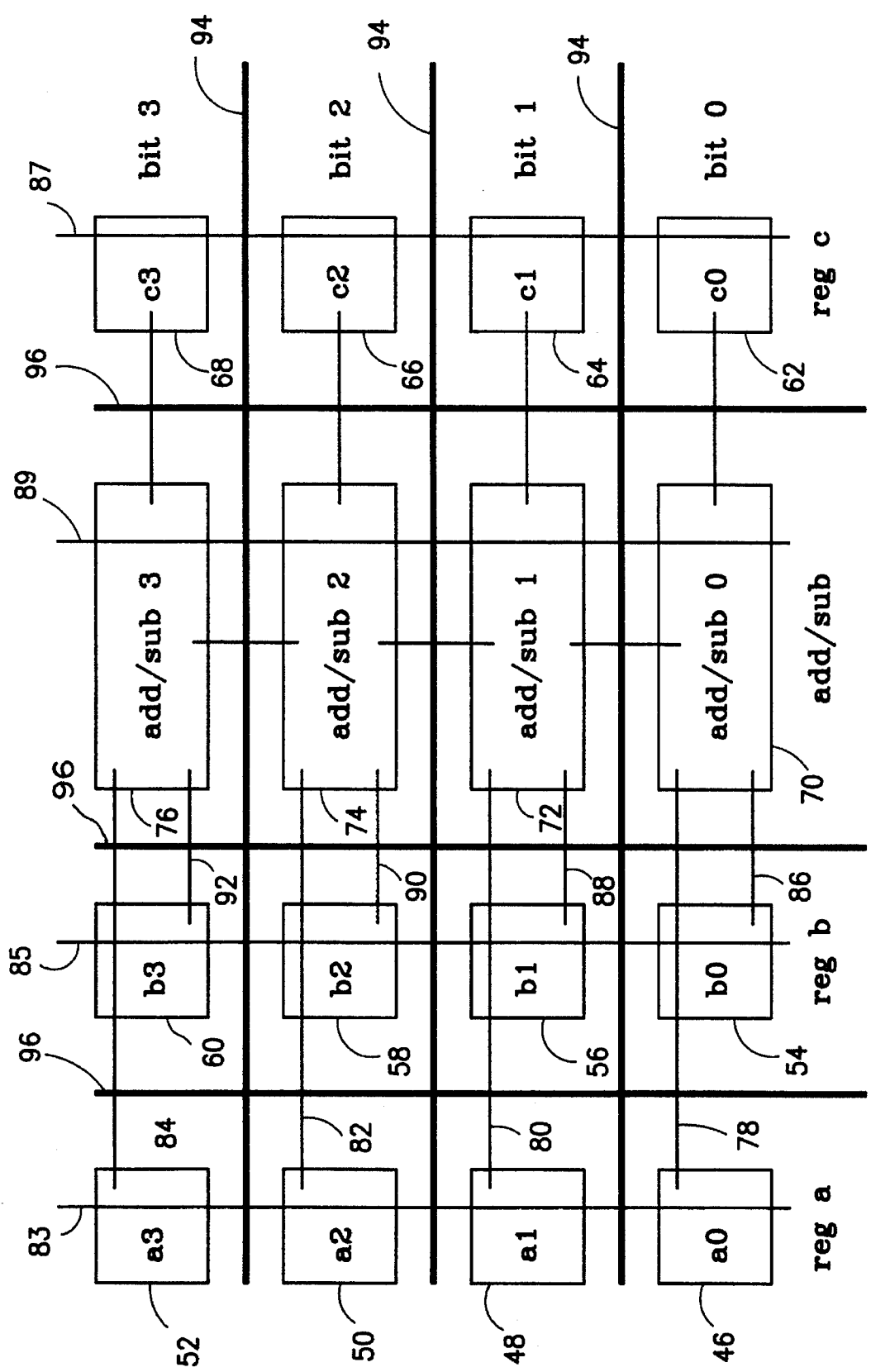
FIG. 3 shows the FIG. 2 floor plan in greater detail.

FIG. 3 illustrates the FIG. 2 floor plan in greater detail, showing bit locations for each of the FIG. 2 functional columns. In FIG. 3, the thick horizontal lines generally labelled 94 and the thick vertical lines generally labelled 96 do not represent control and data lines. Rather, these lines represent boundaries, or visual queues, between bit locations.

As shown in the exemplary FIG. 3 illustration, the floor plan is broken into a regular array of bit-sized pieces with the functional column 34 (corresponding to register "a") being broken into bit locations 46, 48, 50 and 52. These locations represent bits $a_0$ to $a_3$, respectively of register "a". Similarly, locations 54, 56, 58 and 60 represent bits $b_0$ to $b_3$ of register "b" and locations 62, 64, 66 and 68 represent bits $c_0$ to $c_3$ of register "c". Four corresponding locations of the adder/subtractor 40 are represented as locations 70,. 72, 74 and 76. Each bit location can be composed of one or more instances as described previously.

Data wires 78, 80, 82 and 84 connect each of the bit locations 46, 48, 50 and 52 of register "a" with corresponding bit locations 70, 72, 74 and 76 of the adder/subtractor. Similarly, data wires 86, 88, 90 and 92 connect each of the bit locations 54, 56, 58 and 60 with the adder/subtractor locations 70, 72, 74 and 76, respectively. Intersections between wires do not necessarily constitute connections between the wires. Rather, overlapping wires can, for example, be formed on different layers of an integrated circuit.

Control wires 83 and 85 selectively gate data from the registers "a" and "b" into the adder/subtractor locations while control wire 87 selectively gates information from the adder/subtractor locations into the output register "c". The control wire 89 is used to select either the add or the subtract mode for each of the adder/subtractor locations.

Figure 4:
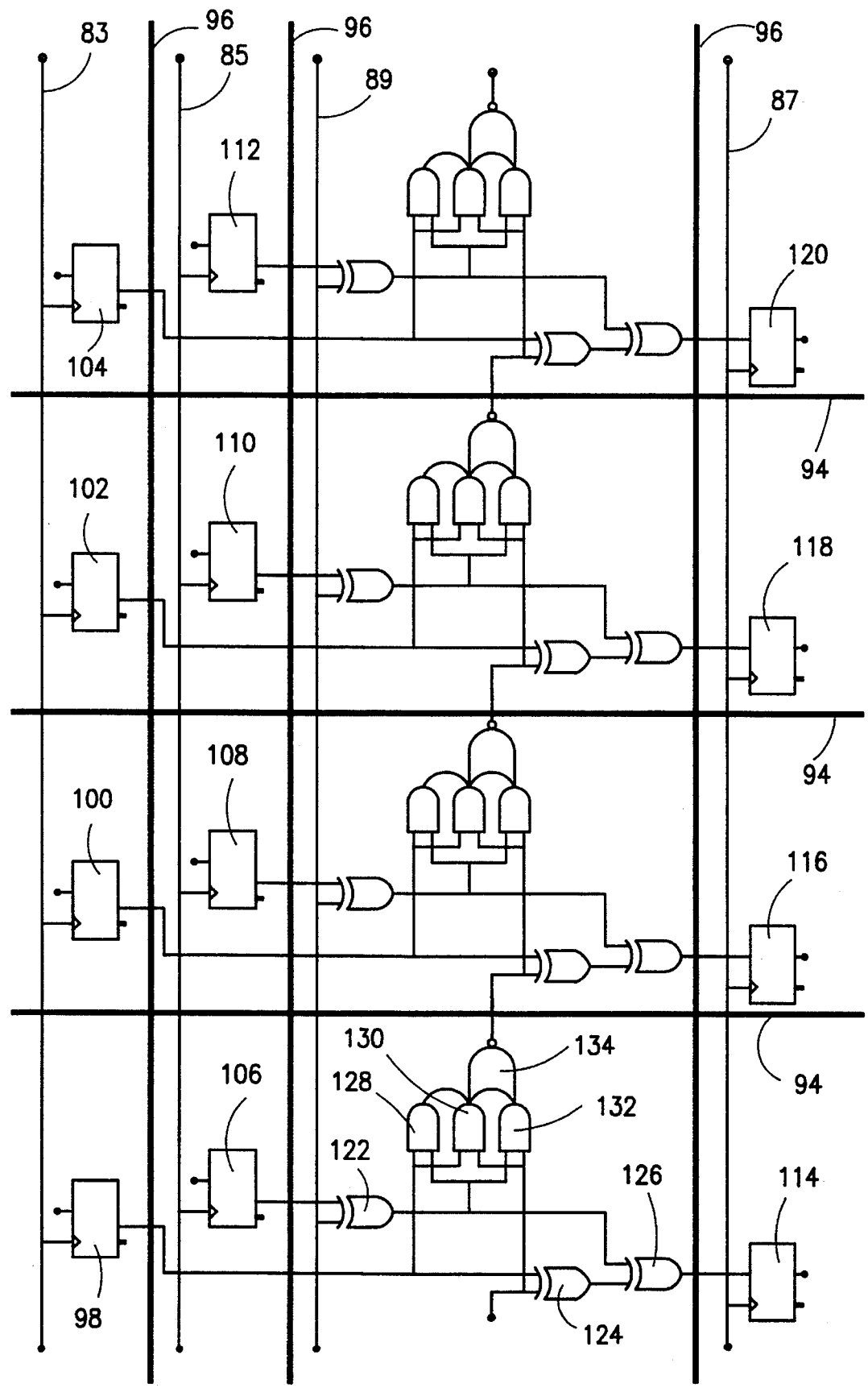
FIG. 4 shows a final, detailed logic representation of the FIG. 3 design.

FIG. 4 shows a more detailed logic representation of the pre-cut FIG. 3 design. For illustration purposes, the boundaries 94 and 96 of FIG. 3 are reproduced in FIG. 4. Each bit location of register "a" is represented in FIG. 4 as one of the flip-flops 98, 100, 102 and 104, respectively. Similarly, each bit location of the registers "b" and "c" is represented as the flip-flop 106, 108, 110, 112, 114, 116, 118 or 120, respectively. The adder/subtractor locations 70, 72, 74 and 76 include a number of instances represented in FIG. 4 as a combination of logic gates needed for adding or subtracting input bits received from the "a" and "b" registers.

Because each of the adder/subtractor locations in FIG. 4 includes a number of identical instances, only those instances associated with one bit location will be discussed in detail. More particularly, the adder/subtractor location 70 of FIG. 3 is shown in FIG. 4 to include exclusive-OR gates 122 and 124 for receiving the lowest order bit from each of the "a" and "b" registers. Outputs of these exclusive-OR gates are input to another exclusive-OR gate 126 for producing an output of the adder/subtractor.

AND gates 128, 130 and 132 and an OR gate 134 produce a carry-over signal for incrementing the next sequential bit location when necessary. The control wires 83, 85, 87 and 89 correspond to those described above with respect to FIG. 3.

After the netlist instances of the FIG. 4 logic components have been associated with one of the pre-cut partitions, optimization of instance placement within the partitioned areas is performed. For example, the aforementioned MINCUT process can be used for final detailed placement of instances in the layout.

Although the foregoing has described the principles, preferred embodiments and modes of operation of the present invention, the invention should not be construed as limited to the particular embodiments discussed. Instead, the above-described embodiments should be regarded as illustrative rather than restrictive.

For example, although the preferred embodiments were described in the context of generating circuit element placement information from a netlist, the same techniques are applicable to instances in gate arrays wherein small functions are combined. Similarly, the above-described methods could be applied to datapath polygons (i.e., symbolic representations of circuit elements which include a number of functions grouped together). Accordingly, it should be appreciated that workers skilled in the art may make variations in the above-described embodiments without departing from the scope of present invention as defined by the following claims.

What is claimed is:

1. A method for determining placement of instances in a layout of electrical or electronic circuits initially represented by a netlist, comprising the steps of:
    attaching position information to netlist instances in a netlist for identifying their approximate position in a regular structure;
    using the attached information for defining partitioned areas of said regular structure;
    generating a circuit layout from the netlist, which layout contains the partitioned areas; and
    optimizing the circuit layout containing the partitioned areas.

2. A method according to claim 1, further comprising a step of:
    providing a hierarchical netlist wherein a top level of the netlist identifies instances which belong to the same functional unit with a common functional unit name, each instance having a unique instance name.

3. A method according to claim 2 further including a step of concatenating each instance name.

4. A method according to claim 1 wherein said step of optimizing further includes a step of separately applying a place-and-route technique to each partitioned area of the circuit layout to optimize instance placement within each of the partitioned areas.

5. A method according to claim 1 wherein said step of attaching further includes a step of pre-cutting the layout into the partitioned areas which form said regular structure, the partitioned areas being used to control placement of instances in the circuit layout.

6. A method according to claim 5 wherein the partitioned areas are arranged in a rectangular grid.

7. A method according to claim 1 wherein each partitioned area contains all netlist instances corresponding to a common functional unit and bit location.

8. A method according to claim 1 wherein said step of optimizing further includes steps of:
    placing each instance in a partitioned area; and
    sub-partitioning each partitioned area vertically, then horizontally, then vertically and so forth in a recursive manner.

9. A method according to claim 8, wherein a cost function technique is employed to sub-partition the circuit layout.

10. A method according to claim 9 wherein the cost function technique is employed to optimize sub-partitioned areas of the circuit layout subject to a constraint that instance interconnection distances are minimized.

11. A method according to claim 1, further comprising a step of providing information that identifies datapath functions and their interconnections from a datapath compiler which produces a hierarchical netlist.

12. The method of claim 11, wherein said step of optimizing further comprises the step of hierarchically decomposing the layout by placing and routing circuit elements which are included in each partitioned area.

13. The method of claim 1 wherein individual instances of the netlist combine to form bit locations of functional units in the circuit layout.

14. The method of claim 1, wherein said step of optimizing includes the steps of:
    sub-partitioning each partitioned area recursively;
    evaluating a cost value associated with a sub-partitioned area, said cost value being a function of the number of nets crossing the sub-partition;
    adjusting the cost value of a sub-partitioned area by placing and routing circuit elements included in the sub-partitioned area to produce an adjusted cost value;
    comparing the cost value with the adjusted cost value; and
    selecting the placement of circuit elements with the sub-partitioned areas having a lower cost value.

15. A method for operating upon netlists so that datapaths can be placed into a regular array of a physical circuit layout, comprising the steps of:
    encoding datapath information as instance names in a netlist generated by a datapath compiler;
    using the encoded datapath information for defining partitioned areas that preserve datapaths;
    generating circuit layouts from the netlist, which layouts contain floor plans of the datapaths.

16. The method of claim 15 further including the step of separately optimizing, for each partitioned area, placement of circuit elements in each partitioned area.

17. The method of claim 16 wherein said step of encoding further includes the step of:
    providing a top level of said netlist that identifies instances which belong to the same functional unit with a common functional unit name, each instance having a unique instance name.

* * * * *